United States Patent
Chen et al.

(10) Patent No.: US 9,753,079 B2
(45) Date of Patent: Sep. 5, 2017

(54) TESTING DEVICE FOR PROPAGATION CHARACTERISTIC OF ELECTROMAGNETIC WAVE IN GAS INSULATED SWITCHGEAR AND TESTING METHOD THEREFOR

(71) Applicants: STATE GRID CORPORATION OF CHINA, Beijing (CN); STATE GRID HUBEI ELECTRIC POWER RESEARCH INSTITUTE, Hubei (CN); CHINA ELECTRIC POWER RESEARCH INSTITUTE, Beijing (CN); XI' AN JIAO-TONG UNIVERISTY, Shaanxi (CN)

(72) Inventors: Jun Chen, Hubei (CN); Jinbin Li, Hubei (CN); Jun Lu, Hubei (CN); Haiqiong Liu, Hubei (CN); Min Chen, Hubei (CN); Hao Wang, Hubei (CN); Jiangang Bi, Beijing (CN); Shuai Yuan, Beijing (CN); Yuan Yang, Beijing (CN); Junhao Li, Shaanxi (CN); Jianfeng Liang, Shaanxi (CN); Yanming Li, Shaanxi (CN)

(73) Assignees: STATE GRID HUBEI ELECTRIC POWER RESEARCH INSTITUTE, Wuhan, Hubei (CN); CHINA ELECTRIC POWER RESEARCH INSTITUTE, Beijing (CN); XI'AN JIAOTONG UNIVERSITY, Xi' An, Shaanxi (CN); STATE GRID CORPORATION OF CHINA, Beijin (CN)

( * ) Notice: Subject to any disclaimer, the term of this patent is extended or adjusted under 35 U.S.C. 154(b) by 311 days.

(21) Appl. No.: 14/654,532

(22) PCT Filed: Nov. 14, 2013

(86) PCT No.: PCT/CN2013/087106
§ 371 (c)(1),
(2) Date: Jun. 21, 2015

(87) PCT Pub. No.: WO2014/107990
PCT Pub. Date: Jul. 17, 2014

(65) Prior Publication Data
US 2015/0369853 A1    Dec. 24, 2015

(30) Foreign Application Priority Data
Jan. 11, 2013    (CN) .......................... 2013 1 0010022

(51) Int. Cl.
*G01R 31/12*    (2006.01)
*H01Q 1/36*    (2006.01)
*H04B 17/00*    (2015.01)

(52) U.S. Cl.
CPC .......... *G01R 31/1254* (2013.01); *H01Q 1/36* (2013.01); *H04B 17/00* (2013.01)

(58) Field of Classification Search
CPC .. G01R 31/1254; H04B 17/00; H04L 63/0236
See application file for complete search history.

(56) References Cited

U.S. PATENT DOCUMENTS

| | | | |
|---|---|---|---|
| 2011/0000772 A1* | 1/2011 | Hanai | H01H 9/167 200/308 |
| 2011/0005809 A1* | 1/2011 | Sologuren-Sanchez | H02G 5/068 174/168 |
| 2011/0156720 A1* | 6/2011 | Di Stefano | G01R 31/1272 324/629 |

* cited by examiner

*Primary Examiner* — Giovanni Astacio-Oquendo
*Assistant Examiner* — Alvaro Fortich

(57) ABSTRACT

A testing device for propagation characteristic of electromagnetic wave in gas insulated switchgear includes an (Continued)

ultrahigh frequency signal generator, a GIS testing chamber, an emitting antenna and a receiving antenna which are provided inside the GIS testing chamber. A detachable disc insulator is provided between the emitting antenna and the receiving antenna. Both terminals of a GIS testing chamber are sealed by polyurethane wave-absorbing sponge; the ultrahigh frequency signal generator is connected with the emitting antenna, and the receiving antenna is connected with a oscilloscope. A guide rod which is fixed by the disc insulator is provided in the GIS testing chamber. The present invention is capable of achieving testing propagation characteristic of partial discharge ultrahigh frequency electromagnetic wave signal of a gas insulated switchgear in a laboratory, so as to master attenuation characteristics of the partial discharge ultrahigh frequency electromagnetic wave signal.

8 Claims, 2 Drawing Sheets

TESTING DEVICE FOR PROPAGATION CHARACTERISTIC OF ELECTROMAGNETIC WAVE IN GAS INSULATED SWITCHGEAR AND TESTING METHOD THEREFOR

CROSS REFERENCE OF RELATED APPLICATION

This is a U.S. National Stage under 35 U.S.C 371 of the International Application PCT/CN2013/087106, filed Nov. 14, 2013, which claims priority under 35 U.S.C. 119(a-d) to CN 201310010022.1, filed Jan. 11, 2013.

BACKGROUND OF THE PRESENT INVENTION

Field of Invention

The present invention relates to the technical field of a partial discharge test for electrical equipments, and more particularly to a testing device for propagation characteristic of electromagnetic wave in a gas insulated switchgear (GIS) and a testing method therefor.

Description of Related Arts

Due to the small occupation space and the good insulation performance, the GIS (Gas Insulated Switchgear) is widely applied in the power system. However, since the GIS has an enclosed structure, once an accident occurs, the consequences are much more serious than the open and separated type equipment, and the restoration of the fault of the GIS is extremely complex.

Partial discharge is generally regarded as a precursor of an insulation failure. The appearance of partial discharge indicates that there is a drawback in the installation, manufacture or even design of the GIS. The continuous partial discharge inside the GIS easily causes insulation breakdown accidents, so that blackout occurs, which brings enormous expense to national economy. Thus, charging the partial discharge of the GIS is very important. Therefore, testing the partial discharge is significant to the early detection and treatment of the GIS insulation failure.

Currently, the partial discharge ultrahigh frequency testing method is widely applied in the live detection of GIS partial discharge and plays a pivotal role in ensuring the safety of the equipment and detecting the defects thereof. While transmitting in the GIS, the partial discharge ultrahigh frequency electromagnetic wave signal generates attenuation. Mastering the attenuation characteristic of the ultrahigh frequency electromagnetic wave signal in the GIS is an important basis for analyzing and detecting on the field. Because the ultrahigh frequency electromagnetic wave signal has various phenomena in propagation, such as mode conversion. The conventional research on the propagation characteristics of the ultrahigh frequency electromagnetic wave signal mainly adopts a simulation method, and a finite-difference time-domain (FDTD) method is adopted for calculating, so as to obtain the propagation characteristic thereof. In fact, various materials are adopted by different manufactures for producing the disc insulators in GIS, and the sizes of the disc insulators are different under the identical voltage level, thus the simulation calculation is not capable of covering all types of the disc insulators. Thus, testing the propagation characteristics of the partial discharge electromagnetic wave signal of the GIS by an experiment in the laboratory to master the impact of the disc insulators on the propagation characteristic is a basis for accurately detecting on the field.

SUMMARY OF THE PRESENT INVENTION

The present invention provides a testing device for propagation characteristic of electromagnetic wave in gas insulated switchgear and a testing method therefore, which is capable of performing experiment for propagation characteristic of electromagnetic waves in the laboratory by replacing a disc insulator.

A testing device for propagation characteristic of electromagnetic wave in a gas insulated switchgear comprises: an ultrahigh frequency signal generator, a GIS testing chamber, an emitting antenna and a receiving antenna which are provided inside the GIS testing chamber;

wherein a detachable disc insulator is provided between the emitting antenna and the receiving antenna;

two terminals of a GIS are sealed by polyurethane wave-absorbing sponge;

the ultrahigh frequency signal generator is connected with the emitting antenna;

the receiving antenna is connected with an oscilloscope; and a guide rod is provided in the GIS testing chamber, wherein the guide rod is fixed by the disc insulator.

Preferably, the GIS testing chamber comprises two chamber sections which are connected by the disc insulator in a middle portion of the GIS testing chamber to form an integral chamber.

Preferably, the two chamber sections are connected by the disc insulator via a flange, a fixing bolt and a fixing nut; and the disc insulator and the flange are sealed by a sealing ring therebetween.

Preferably, external ends of each of the two chambers are sealed by metal cover plates, and the polyurethane wave-absorbing sponge is adhered on an internal side of the metal cover plates.

Preferably, a valve and a barometer are respectively provided on each chamber section, wherein the valve is for charging SF6 gas, and the barometer is for measuring gas pressure.

Preferably, the ultrahigh frequency signal generator is a picosecond pulse generator.

Preferably, both the emitting antenna and the receiving antenna adopts small sale Archimedean double spiral antenna.

A testing method for propagation characteristic of electromagnetic wave in a gas insulated switchgear which adopts the testing device mentioned above, comprises following steps of:

step (1): replacing a disc insulator between two chamber sections with a hollow cylinder and keeping a length of the chamber sections, wherein electromagnetic waves are not transmitted via the disc insulator, sending an ultrahigh frequency electromagnetic wave signal via the emitting antenna and the partial discharge ultrahigh frequency signal generator, receiving the ultrahigh frequency electromagnetic wave signal via a receiving antenna and an oscilloscope, so as to obtain electromagnetic wave signal without access to the disc insulator;

step (2): installing the disc insulator and repeating a process in the step (1), receiving the receiving antenna and the oscilloscope to obtain electromagnetic wave signal passed through the disc insulator;

step (3): respectively comparing time domain and frequency domain of the electromagnetic wave signal obtained in the step (1) with the time domain and the frequency domain with electromagnetic wave signal obtained in the step (2);

wherein the time domain of the electromagnetic wave signal comprising three characteristics of a maximum amplitude, an average amplitude and a signal energy; and wherein to a frequency domain signal, a frequency distribution characteristic is compared;

obtaining influence of the disc insulator on propagation characteristic of the electromagnetic wave signal by comparing the time domain and the frequency domain, so as to obtain the propagation characteristic of the electromagnetic wave signal in GIS.

In the present invention, the emitting antenna provided in the GIS testing chamber and at a first side of the disc insulator inputs the ultrahigh frequency electromagnetic wave signal into the GIS testing chamber. The ultrahigh frequency electromagnetic wave signal is received by the receiving antenna provided on a second side of the disc insulator, in such a manner that electromagnetic wave signal which passes through the disc insulator is obtained via the receiving antenna, in such a manner that testing propagation characteristic of partial discharge ultrahigh frequency electromagnetic wave signal of a gas insulated switchgear can be achieved in a laboratory, so as to master attenuation characteristics of the partial discharge ultrahigh frequency electromagnetic wave signal, and lay a laboratory foundation for accurate detection of the partial discharge of the gas insulated switchgear by field use of an ultrahigh-frequency method.

Figure 1:
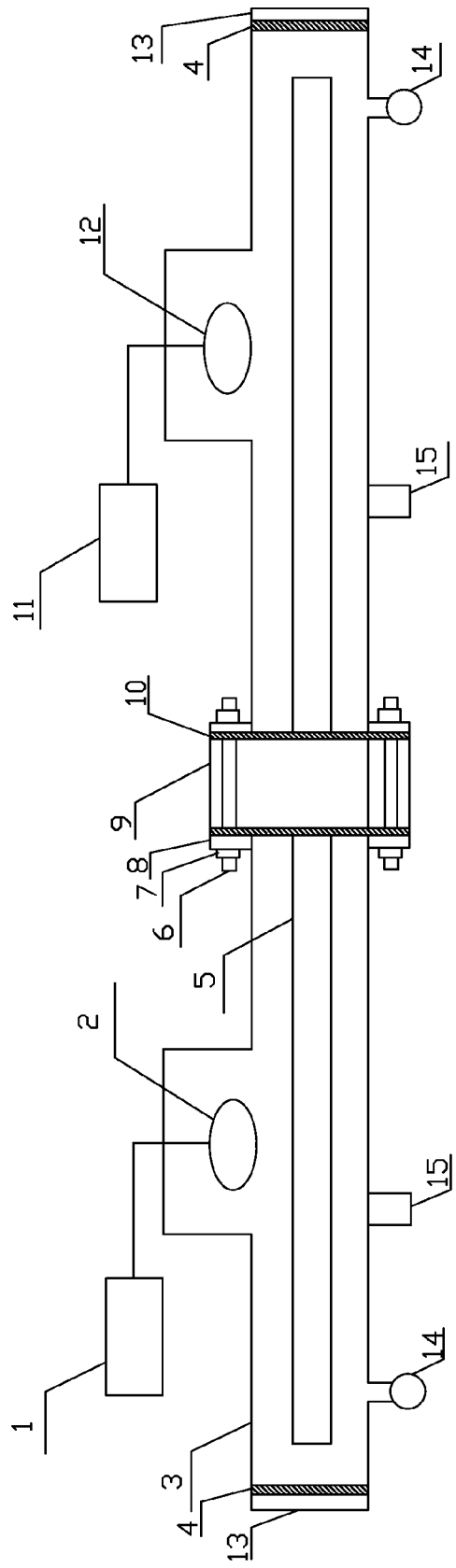
FIG. 1 is a structural schematic view of a testing device for propagation characteristic of electromagnetic wave in a gas insulated switchgear according to a preferred embodiment of the present invention.

In the drawings: 1—ultrahigh frequency signal generator; 2—emitting antenna; 3—GIS testing chamber; 4—polyurethane wave-absorbing sponge; 5—guide rod; 6—fixing bolt; 7—fixing nut; 8—flange; 9—disc insulator; 10—sealing ring; 11—oscilloscope; 12—receiving antenna; 13—end cover plate; 14—barometer; 15—valve.

DETAILED DESCRIPTION OF THE PREFERRED EMBODIMENT

Further description of the technical solution of the present invention is illustrated clearly and completely according to the accompanying drawings.

Referring to FIG. 1 of the drawings, a testing device for propagation characteristic of electromagnetic wave in a gas insulated switchgear (GIS) according to a preferred embodiment of the present invention comprises:

an ultrahigh frequency signal generator 1, a GIS testing chamber 3, an emitting antenna 2 and a receiving antenna 12 which are provided inside the GIS testing chamber 3;

wherein a detachable disc insulator 9 is provided between the emitting antenna 2 and the receiving antenna 12;

two terminals of a GIS are sealed by polyurethane wave-absorbing sponge 4;

the ultrahigh frequency signal generator 1 is connected with the emitting antenna 2;

the receiving antenna 12 is connected with an oscilloscope 11; and a guide rod 5 is provided in the GIS testing chamber 3, wherein the guide rod 5 is made of aluminum and fixed by the disc insulator 9.

A size of the GIS testing chamber is produced according to a size of a 220 kV GIS. The GIS testing chamber comprises two chamber sections, wherein the two chamber sections are connected together to form an integral body via a disc insulator 9 therebetween. A length of each chamber section is 1300 mm and a diameter of an end face of the GIS testing chamber is 560 mm. A diameter of the guide rod 5 is 100 mm, and a length of the guide rod is 1000 mm. The guide rod 5 not only simulates working condition in a practical GIS, but also provides a carrier for the propagation of electromagnetic waves. The whole testing device made of metal materials containing aluminum. The two chamber sections have completely identical structures. External ends of each chamber section are sealed by metal cover plates 13. Polyurethane wave-absorbing sponge 4 having a thickness of 50 mm is adhered in the metal cover plates 13, so as to absorb electromagnetic wave signals and prevent reflection to electromagnetic wave signal at the external ends. The two chamber sections are connected by the disc insulator 9 via a flange 8, a fixing bolt 6 and a fixing nut 7; and the disc insulator 9 and the flange 8 are sealed by a sealing ring 10 therebetween, so as to prevent gas leakage. A valve 15 and a barometer 14 are respectively provided on each chamber section, wherein the valve 15 is for charging SF6 gas, and the barometer 14 is for measuring gas pressure. In this test, SF6 gas under 5 atmospheres of pressure is charged.

In the preferred embodiment, the ultrahigh frequency signal generator 1 can adopt a picosecond pulse generator which is capable of generating steep-sided pulse having a rising edge of 800 ps and emits electromagnetic wave signal at a frequency range of 300 MHz-1 GHz. Both the emitting antenna 2 and the receiving antenna 12 adopt small sale Archimedean double spiral antenna, and are provided inside the GIS testing chamber 3. The emitting antenna 2 and the receiving antenna 12 have identical parameters and band width thereof is at a range of 300 MHz-1.5 GHz. Two ends of the GIS testing chamber 3 are sealed by polyurethane wave-absorbing sponge. The polyurethane wave-absorbing sponge is capable of effectively absorbing electromagnetic wave signal, in such a manner that influence of reflected wave at the ends is avoided.

Since the disc insulator 9 between the emitting antenna 2 and the receiving antenna 12 is installed in the GIS in a detachable manner, the disc insulator 9 can be replaced by various disc insulators made of different materials. The oscilloscope 11 adopts Tektronix MDO4104 which has four channels, a broadband of 1G and a sampling rate of 5 GHz.

When in use, the ultrahigh frequency signal generator 1 inputs ultrahigh frequency electromagnetic wave signal into the GIS testing chamber 3 via the emitting antenna 2 provided inside the GIS testing chamber 3 and on a first side of the disc insulator 9. The ultrahigh frequency electromagnetic wave signal is received by the receiving antenna 12 provided on a second side of the disc insulator 9. Since the two ends of the GIS testing chamber are sealed by polyurethane wave-absorbing sponge, so reflection of electromagnetic wave signal on the ends is avoided, in such a manner that the electromagnetic wave signal passed through the disc insulator 9 is obtained via the receiving antenna 12. In the experiment, the disc insulator 9 is not adopted in the beginning, so as to receive the receiving signal without the disc insulator. Then by replacing disc insulators of different types or made of different materials, so as to obtain electromagnetic wave signal passed through the disc insulator, so as to research influences of disc insulator on propagation characteristic of electromagnetic wave.

Figure 2:
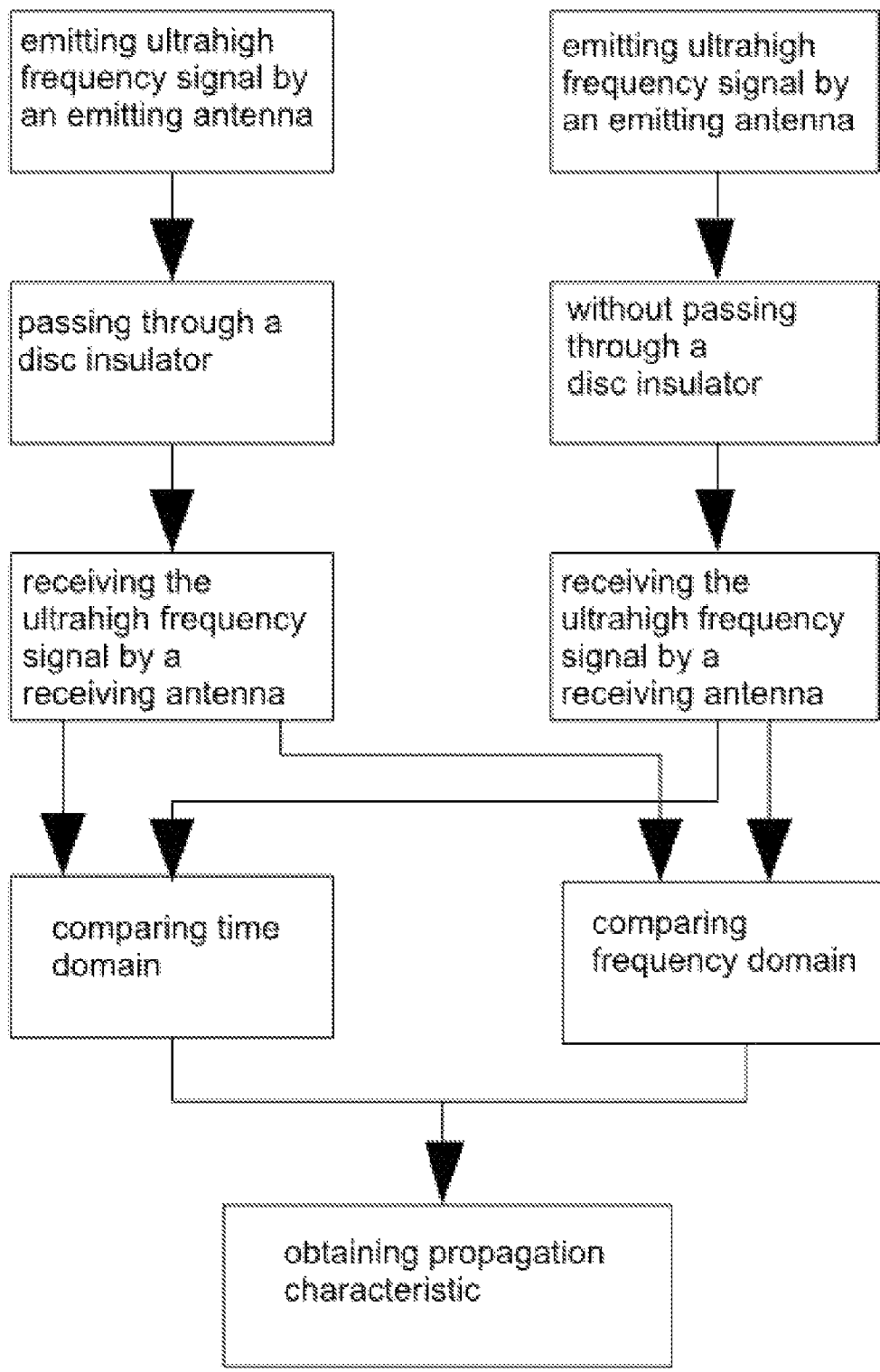
FIG. 2 is a flow chart of a testing method according to another preferred embodiment of the present invention.

Referring to FIG. 2 of the drawings, the present invention further provides a testing method for propagation characteristic of electromagnetic wave in a gas insulated switchgear which adopts the testing device mentioned above, comprising following steps of:

step (1): replacing a disc insulator 9 between two chamber sections with a hollow cylinder and keeping a length of the chamber sections, wherein electromagnetic waves are not transmitted via the disc insulator 9, sending an ultrahigh frequency electromagnetic wave signal via the emitting antenna 2 and the partial discharge ultrahigh frequency signal generator 1, receiving the ultrahigh frequency electromagnetic wave signal via a receiving antenna 12 and an oscilloscope 11, so as to obtain electromagnetic wave signal without access to the disc insulator;

step (2): installing the disc insulator 9 and repeating a process in the step (1), receiving the receiving antenna 12 and the oscilloscope 11 to obtain electromagnetic wave signal passed through the disc insulator 9;

step (3): respectively comparing time domain and frequency domain of the electromagnetic wave signal obtained in the step (1) with the time domain and the frequency domain with electromagnetic wave signal obtained in the step (2);

wherein the time domain of the electromagnetic wave signal comprising three characteristics of a maximum amplitude, an average amplitude and a signal energy; and wherein to a frequency domain signal, a frequency distribution characteristic is compared;

obtaining influence of the disc insulator on propagation characteristic of the electromagnetic wave signal by comparing the time domain and the frequency domain, so as to obtain the propagation characteristic of the electromagnetic wave signal in GIS.

In the experiment, by replacing disc insulators of different types or made of different materials, so as to obtain electromagnetic wave signal passed through the disc insulator, so as to research influences of disc insulator on propagation characteristic of electromagnetic wave.

One skilled in the art will understand that the embodiment of the present invention as shown in the drawings and described above is exemplary only and not intended to be limiting.

It will thus be seen that the objects of the present invention have been fully and effectively accomplished. Its embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A testing device for propagation characteristic of electromagnetic wave in a gas insulated switchgear (GIS), comprising:
an ultrahigh frequency signal generator (1), a GIS testing chamber (3), an emitting antenna (2) and a receiving antenna (12) which are provided inside the GIS testing chamber (3);
wherein a detachable disc insulator (9) is provided between the emitting antenna (2) and the receiving antenna (12);
two terminals of the GIS are sealed by polyurethane wave-absorbing sponge (4);
the ultrahigh frequency signal generator (1) is connected with the emitting antenna (2);
the receiving antenna (12) is connected with an oscilloscope (11); and
a guide rod (5) is provided in the GIS testing chamber (3) and is fixed by the detachable disc insulator (9).

2. The testing device, as recited in claim 1, wherein the GIS testing chamber (3) comprises two chamber sections which are connected by the disc insulator (9) in a middle portion of the GIS testing chamber (3) to form an integral chamber.

3. The testing device, as recited in claim 2, wherein the two chamber sections are connected by the disc insulator (9) via a flange (8), a fixing bolt (6) and a fixing nut (7); and the disc insulator (9) and the flange (8) are sealed by a sealing ring (10) therebetween.

4. The testing device, as recited in claim 2, wherein external ends of each of the two chambers are sealed by metal cover plates (13), and the polyurethane wave-absorbing sponge (4) is adhered on an internal side of the metal cover plates (13).

5. The testing device, as recited in claim 2, wherein a valve (15) and a barometer (14) are respectively provided on each chamber section, wherein the valve (15) is for charging SF6 gas, and the barometer (14) is for measuring gas pressure.

6. The testing device, as recited in claim 1, wherein the ultrahigh frequency signal generator (1) is a picosecond pulse generator.

7. The testing device, as recited in claim 1, wherein both the emitting antenna (2) and the receiving antenna (12) adopts small sale Archimedean double spiral antenna.

8. A testing method for propagation characteristic of electromagnetic wave in a gas insulated switchgear (GIS), comprising following steps of:
step (1): replacing a disc insulator (9) between two chamber sections with a hollow cylinder and keeping a length of the chamber sections, wherein electromagnetic waves are not transmitted via the disc insulator (9), sending an ultrahigh frequency electromagnetic wave signal via an emitting antenna (2) and a partial discharge ultrahigh frequency signal generator (1), receiving an ultrahigh frequency electromagnetic wave signal via a receiving antenna (12) and an oscilloscope (11), so as to obtain electromagnetic wave signal without access to the disc insulator;

step (2): installing the disc insulator (9) and repeating a process in the step (1), receiving the receiving antenna (12) and the oscilloscope (11) to obtain electromagnetic wave signal passed through the disc insulator (9); and step (3): respectively comparing time domain and frequency domain of the electromagnetic wave signal obtained in the step (1) with the time domain and the frequency domain with electromagnetic wave signal obtained in the step (2);

wherein the time domain of the electromagnetic wave signal comprising three characteristics of a maximum amplitude, an average amplitude and a signal energy; and wherein to a frequency domain signal, a frequency distribution characteristic is compared;

obtaining influence of the disc insulator on propagation characteristic of the electromagnetic wave signal by comparing the time domain and the frequency domain, so as to obtain the propagation characteristic of the electromagnetic wave signal in the GIS.

* * * * *